US007663382B2

United States Patent
Corulli et al.

(10) Patent No.: US 7,663,382 B2
(45) Date of Patent: Feb. 16, 2010

(54) HIGH-SPEED CAPACITOR LEAKAGE MEASUREMENT SYSTEMS AND METHODS

(75) Inventors: Charles Corulli, Issaquah, WA (US); Gregory Olmstead, Sammamish, WA (US); Donald B. Snow, Mercer Island, WA (US)

(73) Assignee: Rudolph Technologies, Inc., Flanders, NJ (US)

( * ) Notice: Subject to any disclaimer, the term of this patent is extended or adjusted under 35 U.S.C. 154(b) by 168 days.

(21) Appl. No.: 11/668,457

(22) Filed: Jan. 29, 2007

(65) Prior Publication Data
US 2007/0177417 A1    Aug. 2, 2007

Related U.S. Application Data

(60) Provisional application No. 60/762,967, filed on Jan. 27, 2006.

(51) Int. Cl.
*G01R 27/08* (2006.01)
*G01R 31/12* (2006.01)
*G01R 27/26* (2006.01)

(52) U.S. Cl. .................. 324/713; 324/548; 324/678

(58) Field of Classification Search ............. 324/713, 324/548
See application file for complete search history.

(56) References Cited

U.S. PATENT DOCUMENTS

| 4,765,184 | A  | * | 8/1988  | Delatorre ........... 73/152.51 |
| 5,899,923 | A  | * | 5/1999  | Kroll et al. ............ 607/5 |
| 6,025,567 | A  | * | 2/2000  | Brooks ................ 209/574 |
| 6,737,877 | B1 | * | 5/2004  | Hatton et al. .......... 324/723 |
| 7,015,705 | B2 | * | 3/2006  | Inaba et al. ........... 324/678 |
| 7,078,887 | B1 | * | 7/2006  | Eckhardt et al. ..... 324/76.53 |
| 7,148,697 | B2 | * | 12/2006 | Doljack ................ 324/548 |
| 2006/0186946 | A1 | * | 8/2006 | Hughes ................ 327/427 |

* cited by examiner

*Primary Examiner*—Jeff Natalini
(74) *Attorney, Agent, or Firm*—Dicke, Billig & Czaja, PLLC

(57) ABSTRACT

Systems and methods according to aspects of the present invention are described. The systems and methods enable charging, soaking, and measuring of capacitors to be conducted quickly. Charging and soaking typically occurs in parallel and certain embodiments facilitate the measuring of capacitor leakage by sequentially disconnecting each capacitor and measuring the time for voltage on the capacitor to reach a predetermined threshold. Further, all capacitors can be disconnected from a charging source simultaneously and voltages can be measured for each capacitor simultaneously. Monitoring can be periodic in nature. Substantial time savings in the calculation device of leakage values and parameters can be attained.

9 Claims, 5 Drawing Sheets

HIGH-SPEED CAPACITOR LEAKAGE MEASUREMENT SYSTEMS AND METHODS

CROSS-REFERENCE TO RELATED APPLICATIONS

The present application claims benefit of priority from U.S. Provisional Patent Application Ser. No. 60/762,967, titled "System and Method for High-Speed Capacitor Leakage Measurements" and filed Jan. 27, 2006, the contents of which are incorporated herein by reference and for all purposes.

BACKGROUND OF THE INVENTION

1. Field of the Invention

The present invention relates generally to the field of electrical test methods and equipment and more particularly to high-speed electrical testing of capacitors.

2. Description of Related Art

Rapid testing of capacitor leakage is important in the semiconductor industry. In the semiconductor industry, many replicate components, or die, are created on a single semiconductor wafer. Each of the individual die are electrically tested, commonly with a method called "probing." During the probing process, a grid array of fine tungsten wires is touched down on the metallized bonding pads of each die. The tungsten wires are in turn connected to test equipment that is used to evaluate the electrical quality of each die. More specifically, the fine tungsten wires, or other contact media, known in the art as "probe card pins" or "probe pins," are arranged on conventional printed circuit boards or test cards known in the art as "probe cards" or "probe array cards." Probe cards are in turn connected to electrical test equipment known in the art as "probers" or "prober machines."

Precision is important when testing electrical components but obtaining test results in a timely fashion is often equally important. This is especially true when many components are to be tested. An ideal capacitor that is charged to a steady state condition and disconnected from other components would hold its charge forever. However, certain intrinsic properties of real capacitors cause discharge over time. As depicted in FIG. 1, after a capacitor 10 is charged to voltage $V_C$ 16, extrinsic components 12 such as inadvertent connections or solder flux can cause or increase a leakage current 14 that results in discharge of capacitor 10. By measuring the leakage properties of capacitor 10, it is possible to determine if capacitor 10 meets its specifications, is installed properly, and whether connected or surrounding circuits are behaving as expected.

Referring now to FIG. 2, conventional methods of leakage testing test one capacitor 10 at a time. A voltage source initially provides voltage $V_C$ 16 to charge and soak capacitor 10. Once capacitor 10 is fully charged and soaked, a voltage source 20 provides a current to sense resistor 24 and the resultant voltage drop across sense resistor 24 is recorded as a measurement 220 (provided by voltage detector 22) of the amount of current required to counteract leakage current 14 such that capacitor 10 holds its charge. Various problems arising from this method to leakage measurement make the method unattractive for measuring complex systems that may contain hundreds or even thousands of large capacitors. One problem lies with the sense resistor 24. To achieve adequate resolution for very small currents, the conventional approach requires utilizing a large sense resistor 24. For example, a capacitor leakage current 14 of 5 nA would cause only a 500 µV across a 100 KΩ sense resistor 14 and, in the example, a test capacitor 10 having a capacitance of 100 µF would have a 10 second time constant. Such a circuit time constant would require approximately 150 seconds to charge, soak, and settle a capacitor 10.

Another problem with the method of testing is the limitation that only one capacitor can be tested at a time. For a circuit containing over 100 capacitors, it may take over four hours to obtain accurate leakage currents for the entire circuit. A conventional probe card may contain hundreds of capacitors that require repeated testing throughout the probe card's development and useful life. A manufacturer loses revenue for every minute that the probing process is inoperable, due to a probe card malfunction for example. What is needed in the art is a high speed method for accurately testing a multitude of capacitors.

BRIEF SUMMARY OF THE INVENTION

Certain embodiments of the present invention resolve issues and difficulties associated with the measurement of capacitor leakage current. Certain embodiments provide systems and methods that enable charging, soaking, and measuring of capacitors to be conducted quickly and in parallel.

Certain embodiments of the invention provide systems and methods for measuring capacitor leakage comprising the steps of providing a charging current to a plurality of capacitors, wherein the current charges and soaks the plurality of capacitors. Capacitors can be disconnected from the charging current and their voltage monitored according to a programmed sequence. Monitoring can be periodic in nature. Typically, large numbers of capacitors can be charged and soaked in parallel. The time required for discharge of the capacitors can be monitored sequentially and in parallel, thereby generating substantial time savings in the calculation device of leakage values and parameters.

DETAILED DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the components referred to herein by way of illustration.

Certain embodiments of the present invention provide systems and methods for measuring capacitor leakage that can be incorporated in metrology and other systems. Before measuring leakage in a capacitor, the capacitor may first be charged and soaked. A capacitor is typically charged to obtain a desired steady state voltage across the capacitor and at measurement nodes or points. Soaking can be defined as the time required to minimize dielectric absorption contribution in the capacitor. The dielectric absorption contribution is proportional to the capacitance value. For example, a 0.1 µF capacitor must soak for approximately 0.5 seconds while a 1000 µF capacitor must soak for approximately 300 seconds.

Figure 1:
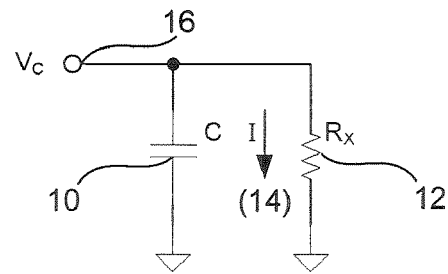
FIG. 1 is a schematic representation of leakage in a capacitor.
Figure 2:
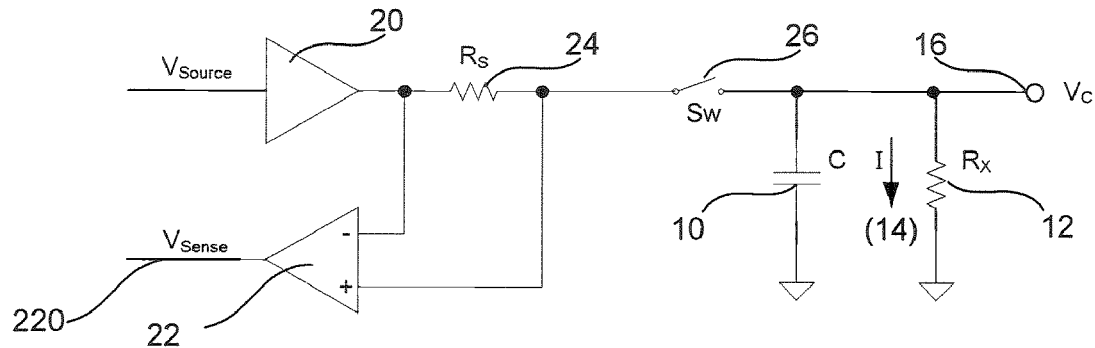
FIG. 2 is a schematic representation of a simplified example of a measurement system according to certain aspects of the invention.
Figure 3:
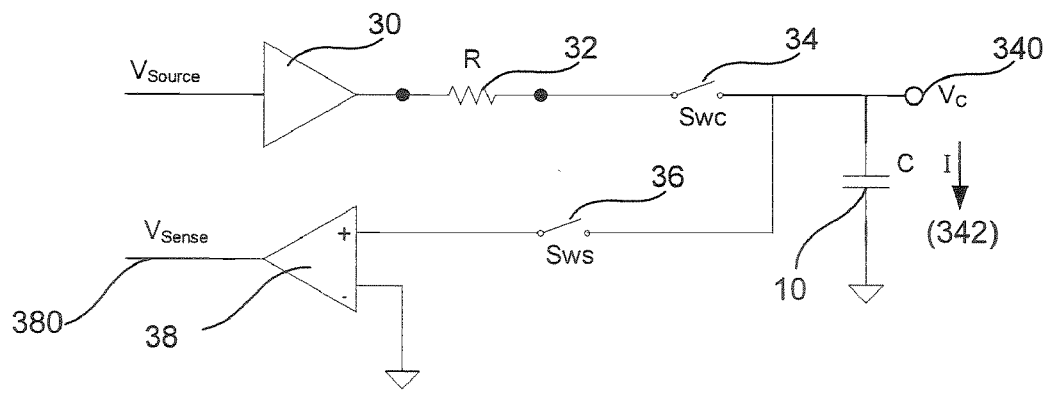
FIG. 3 is a schematic representation of a simplified example of a measurement system capable of parallel sensing according to certain aspects of the invention.

Referring to FIG. 3, in certain embodiments of the invention, a capacitor 10 can be fully charged and soaked using a charging source 30 such as a voltage source, a current source, or other charging system. In certain embodiments, a series resistor 32 can be used that has a smaller value than required in conventional measurement systems and methods. Series resistor 32 is typically provided to limit current provided to the capacitor. Because of the reduced resistance value of series resistor 32, the time constant of the circuit can be relatively small, even for large capacitor values.

After charging and soaking, the charging source 30 may be disconnected from capacitor 10 using a first switch 34 which may be regarded as a charging circuit control switch. A second switch 36 can then connect the charged capacitor to a voltage sense circuit 38 to provide a measurement 380 of capacitor voltage 340. In certain embodiments, capacitor voltage 340 may be monitored over a period of time. In certain embodiments, monitoring capacitor voltage 340 can include periodically measuring capacitor voltage 340.

In certain embodiments, monitoring can be performed by a computer system configured to control measurement of voltages, record data, and calculate capacitor parameters including leakage current. In performing measurements and associated calculations, measurements of capacitor voltage 340 may be recorded before and/or after the voltage source 30 is disconnected from capacitor 10. Capacitor voltage 340 may then be monitored until it has dropped by a predetermined value or crossed a predetermined threshold. In one example, a discharge time and change in voltage can be monitored and recorded and, based on these measured values, leakage current may be calculated as follows:

$$I = C\frac{dv}{dt}.$$    Equation 1

The period of time over which measurements are taken can vary depending upon test circumstances, capacitor characteristics, measurement system accuracy and so on. In certain embodiments, the time required for voltage to drop sufficiently may be measurable in tens of seconds.

In certain embodiments, nominal characteristics of capacitor 10 may be determined using any suitable means having sufficient accuracy. Characteristics can include capacitance which can be analytically determined for each component prior to measuring leakage. Characteristics of a device can be maintained in storage for use in subsequent tests. It will be appreciated that more than one method can be employed or combined to determine component characteristics. Methods are typically selected based on parameters and configuration requirements including the characteristics of individual devices, characteristics of groups of devices and circuit configuration and characteristics.

Figure 4:
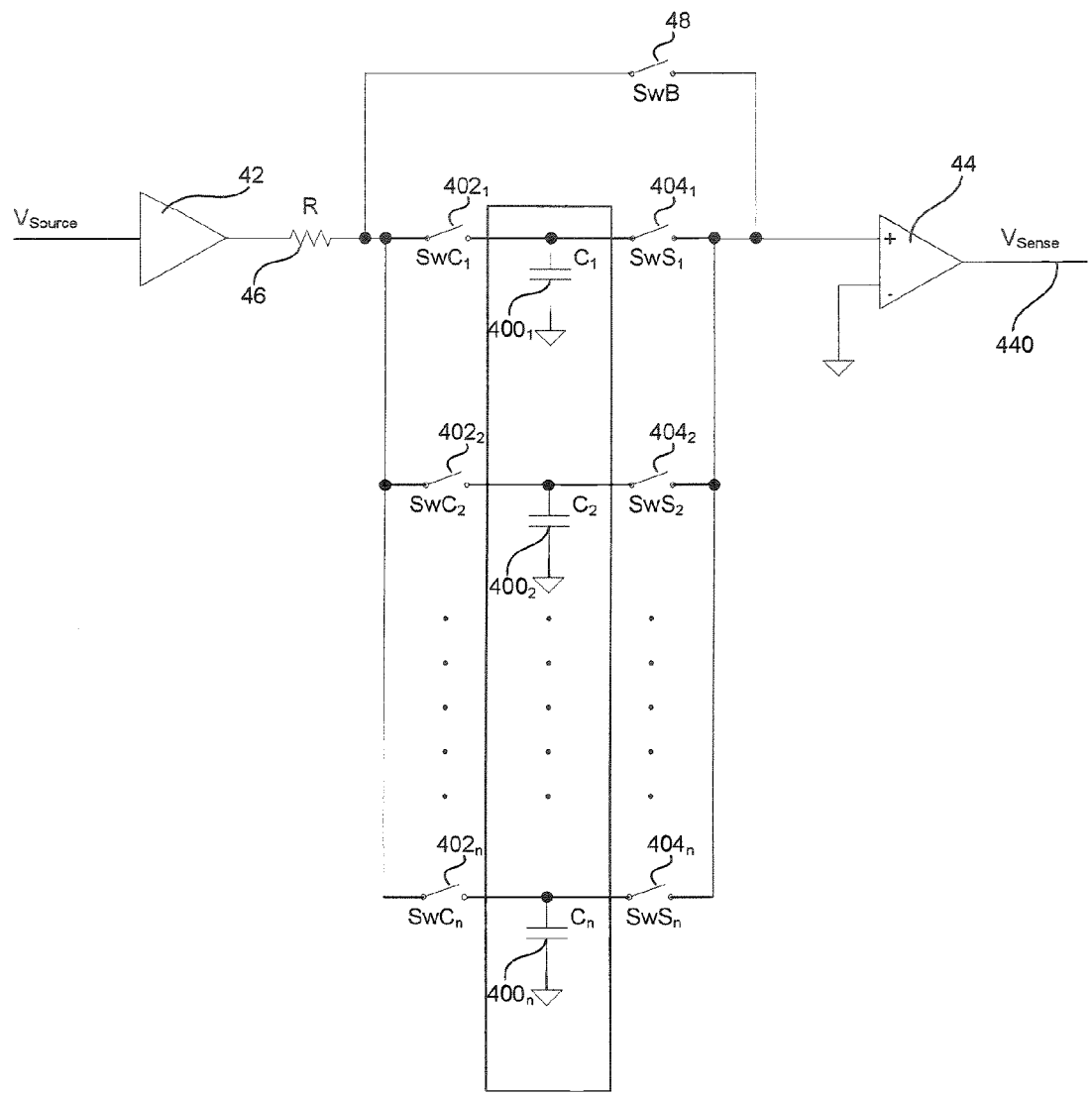
FIG. 4 is a schematic representation of an example of a measurement system according to certain aspects of the invention.

Referring to FIG. 4, certain embodiments provide systems and methods for charging and soaking multiple capacitors simultaneously. In the example shown in FIG. 4, a charging source 42 can provide a current to more than one capacitor $(C_1-C_n)$ $400_1$-$400_n$ in order to charge and soak each capacitor $400_1$-$400_n$ simultaneously. Typically, one or more switches $402_1$-$402_n$ electrically connect charging source 42 through optionally provided series resistor 46. After being charged and soaked, a first capacitor $400_1$ may be removed from the charging source 42 by opening a corresponding switch $400_1$. First capacitor $400_1$ may then be connected to a measurement device 44 by closing switch $404_1$. Typically, other switches $404_2$-$404_n$ are opened to isolate first capacitor $400_1$ from the other capacitors $400_2$-$400_n$ during voltage measurement.

In certain embodiments, electrical connection between charging source 42 and each of the other capacitors $400_2$-$400_n$ is maintained until the leakage of first capacitor $400_1$ can be measured and recorded. A second capacitor $400_2$ may then be measured in similar fashion. Each of capacitors $400_1$-$400_n$ can be tested sequentially until all of the capacitors $400_1$-$400_n$ have been tested. It will be appreciated that significant time savings accrue from the simultaneous charging and soaking of two or more capacitors under test.

In certain embodiments additional time savings can be obtained by measuring capacitor leakage of more than one capacitor at the same time. For example, capacitors $400_1$-$400_n$ may be connected to charging source 42 by closing each of charging switches $402_1$-$402_n$ to permit capacitors to be charged and soaked simultaneously and in parallel. Next, each of capacitors $400_1$-$400_n$ may be disconnected from the charging source and from one another by opening charging switches $402_1$-$402_n$. Sensing switches $404_1$-$404_n$ are typically maintained opened before charging source 42 is disconnected from capacitors $400_1$-$400_n$. Capacitors $400_1$-$400_n$ may then be allowed to discharge separately but simultaneously.

Next, the voltage on each of capacitors $400_1$-$400_n$ can be measured individually by sequentially closing and then reopening each of switches $404_1$-$404_n$, or selected ones of the switches, typically in a periodic fashion. Thus, at each step in a repeating sequence, the voltage across one of capacitors $400_1$-$400_n$ can be measured in isolation from the voltage on the other capacitors. The time at which voltage across each capacitor $400_1$-$400_n$ is detected to have dropped below a predetermined threshold value can then be recorded; e.g. a predetermined threshold value may be set at 10 mV and the time measured represents the elapsed time for a voltage to reach the 10 mV or for the absolute value of the voltage to decrease by 10 mV. In certain embodiments, measurements of elapsed time may be expressed in terms of the periodicity of the sequence.

Leakage calculations can be performed using the measured elapsed times and results stored and processed further as desired. In certain embodiments, measurement of voltage across a capacitor can cease when the voltage crosses the predetermined threshold. However, it may be advantageous to continue measurement of all voltages to obtain a more complete characteristic of each capacitor. Bypass switch may be used to discharge all capacitors $400_1$-$400_n$ and to calibrate voltage sensing device 44 and for other purposes.

Figure 5:
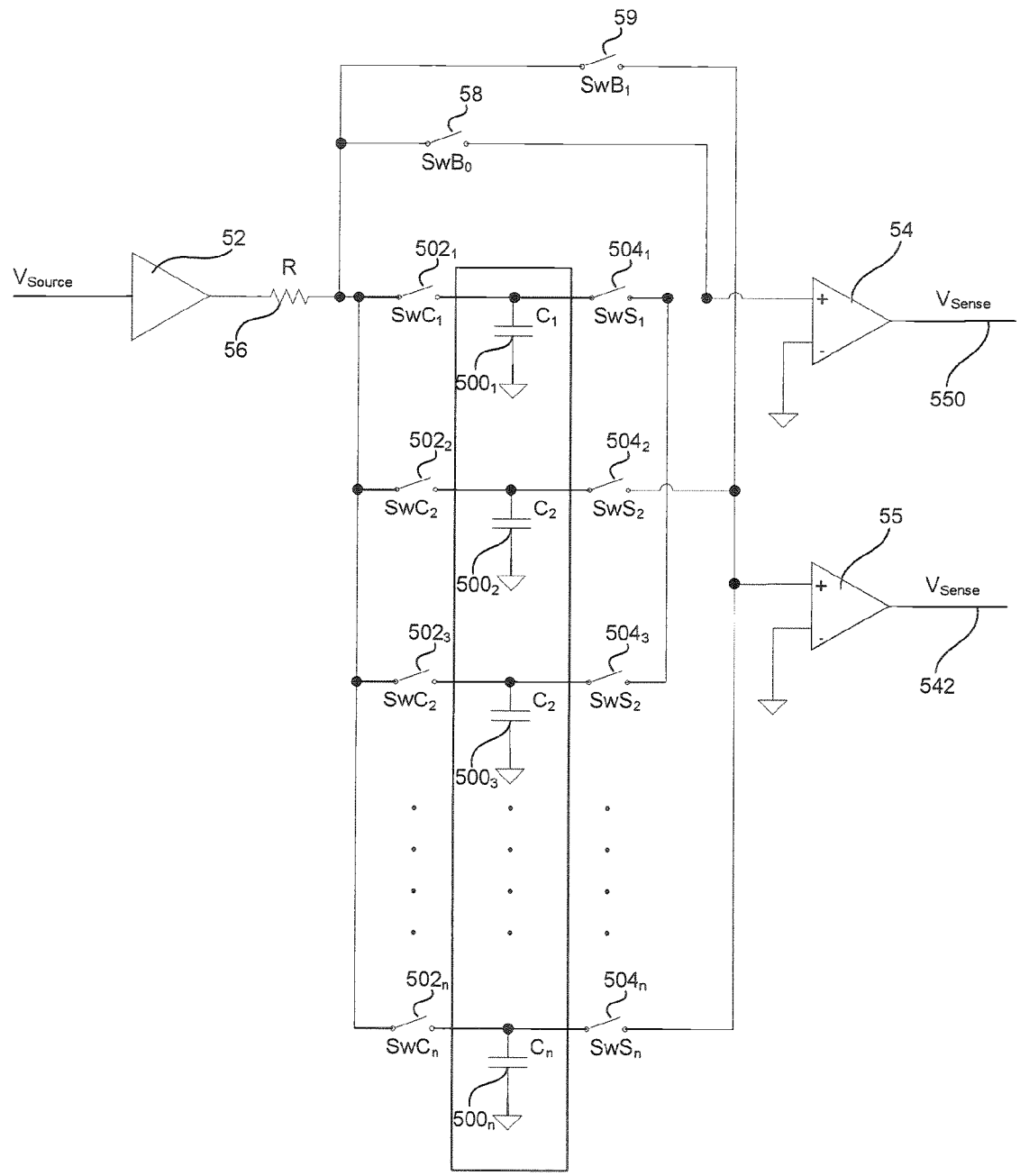
FIG. 5 is a schematic representation of an example of a measurement system according to certain aspects of the invention.

Referring now to FIG. 5, in certain embodiments, multiple sensing devices 54 and 55 can be used to measure capacitor leakage in large numbers of capacitors $500_1$-$500_n$. Capacitors $500_1$-$500_n$ may be initially electrically connected to charging source 52 through charging circuit switches $502_1$-$502_n$ such that each of capacitors $500_1$-$500_n$ are charged and soaked in parallel. Two or more of capacitors $500_1$-$500_n$ may then be disconnected from the charging source and from one another by opening selected ones of switches $502_1$-$502_n$. In certain embodiments, all capacitors $500_1$-$500_n$ are monitored simultaneously and thus all capacitors are disconnected from the charging source 52 and from each other by opening switches $500_1$-$500_n$. Thereafter, each of sensing devices 54 and 55 can be connected to one of capacitors $500_1$-$500_n$ for measuring current voltage. As described above, sequential measurement of voltage on individual ones of capacitors $500_1$-$500_n$ can be performed by one of voltage sensors 54 and 55 by sequencing closure of switches $504_1$-$504_n$. It will be appreciated that the quantity of voltage sensors to be used may be determined by factors including the number of items to be tested, sample times associated with voltage sensors 54 and 55 and processing capabilities of computers and controllers used in the system. Additionally, the sequencing of switches $504_1$-$504_n$ can be configured to initially prioritize measurements based on capacitor size, circuit configuration and other parameters. This prioritization can allow frequent sampling of voltages for rapidly discharging capacitors and discontinuation of sampling of these rapidly discharging capacitors when they cross predetermined threshold voltage levels. Thus, sampling rates for more slowly discharging capacitors can be increased over time.

In certain embodiments the time elapsed during leakage measurement of large numbers of capacitors can be little or no more than the time required to measure leakage in the capacitor having the longest discharge time. Thus, time savings can be accrued by replacing an essentially serial measurement process with highly parallel processes and methods. These methods may be able to accommodate large numbers of different capacitor values that can be measured in thousands.

Figure 6:
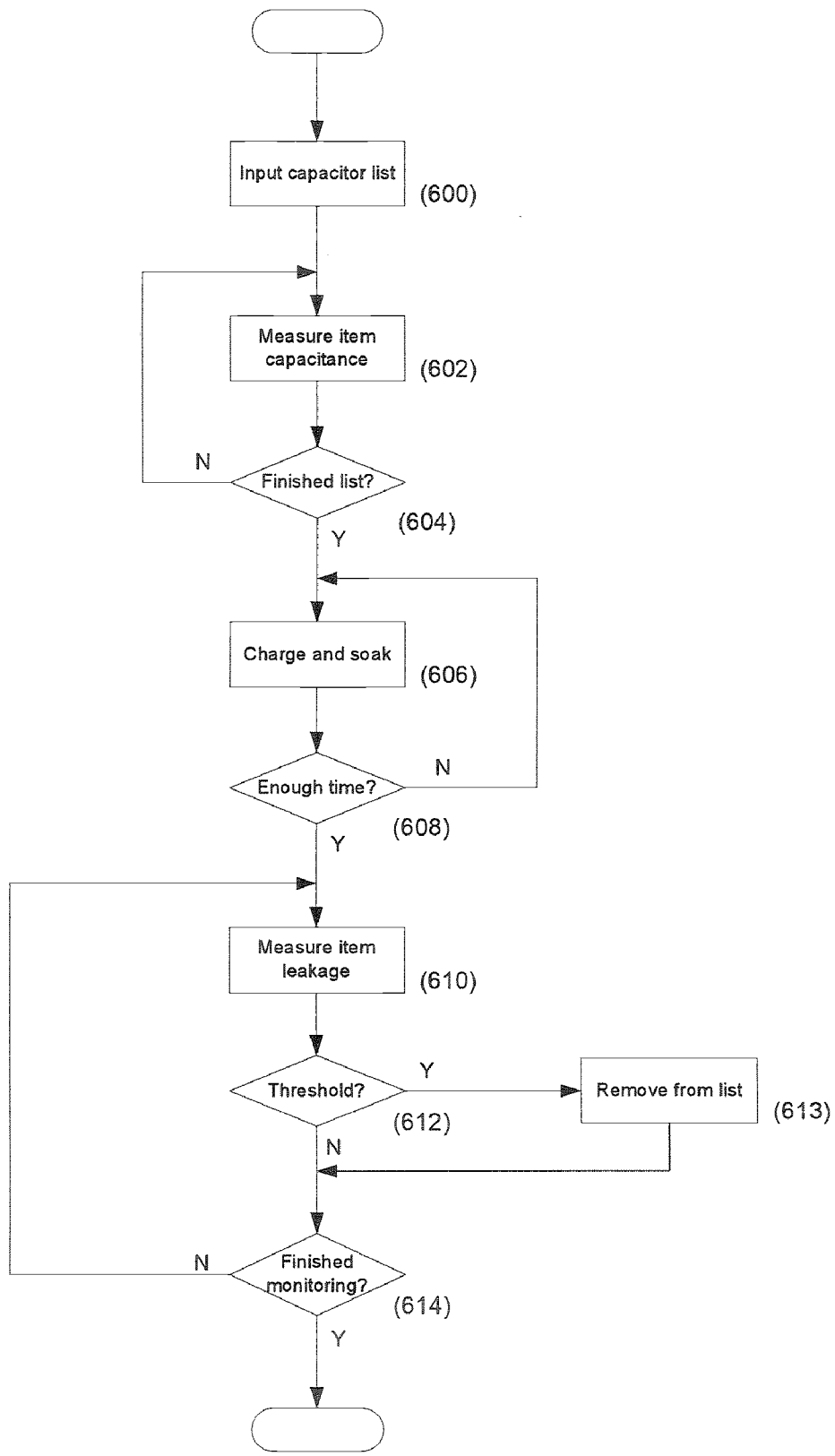
FIG. 6 is a flowchart of a process for measuring leakage according to certain aspects of the invention.

FIG. 6 is a simplified flow diagram further illustrating certain aspects of the invention. At step 600, a list of capacitors to be tested can be generated. The list may identify all capacitors on a device or in a circuit together with corresponding operational characteristics. The list may be obtained electronically from previously entered information, from CAD CAM systems and by manual entry. Next, capacitance of each item may be individually measured at step 602 until capacitance for all items in the list is obtained (step 604). The list can include a combination of previously known capacitance values and newly measured capacitances. At step 606, the capacitors are charged and soaked. Charge and soak time can be calculated from the information provided that identifies the capacitance of the items to be tested. This information may include other data affecting charge and soak time. Typically, a timeout controls charge and soak time at step 608, although other methods of determining charge and soak periods may be implemented. At step 610, charging sources have been removed from one or more capacitors and discharge is in progress. Discharge is monitored, typically using voltage sensing. If the voltage on the capacitor has passed a threshold value at step 612, the elapsed time can be recorded for the capacitor and the capacitor may optionally be removed from the list of items to be monitored at step 613. At step 614, the list is checked to determine if any items are still to be monitored or measured. If items remain on the list, then monitoring continues. If items are being monitored individually, then a next device to be measured is disconnected from the charging source. Monitoring continues.

Table 1 provides an example potential improvement in capacitor leakage test time of the present invention over that of the conventional method in an example where leakage in one hundred 100 μF capacitors is measured.

TABLE 1

| | Charge Time (sec) | Soak Time (sec) | Capacitor Time (sec) | Measure Time (sec) | Total Test Time (min) |
|---|---|---|---|---|---|
| Conventional Method | 63 | 15000 | 2.5 | 2000 | 284.4 |
| Parallel charge/soak | 63 | 150 | 2.5 | 2000 | 36.9 |
| Parallel charge/soak/measure | 63 | 150 | 2.5 | 20 | 3.9 |

Figure 7:
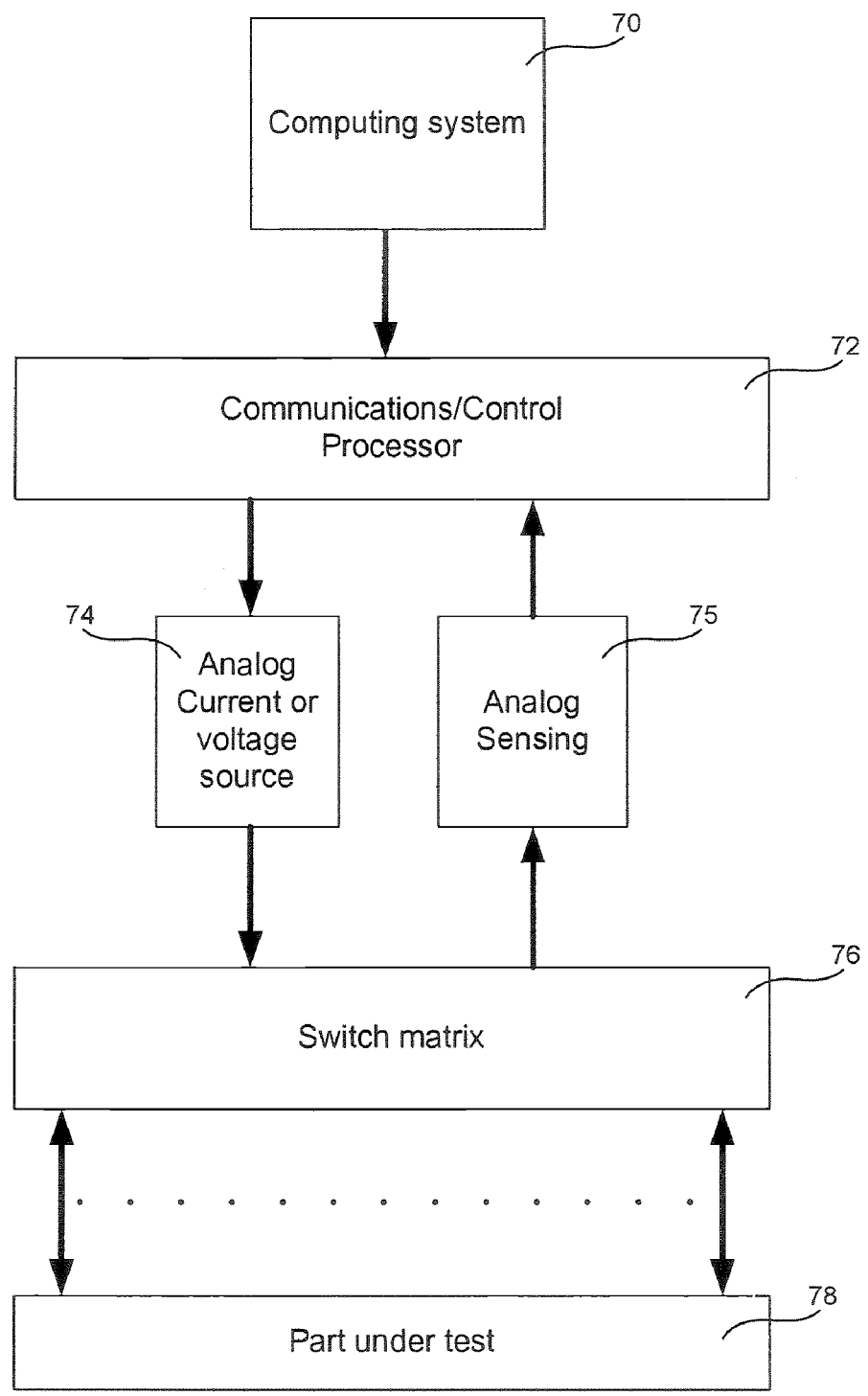
FIG. 7 is a block schematic showing components of a leakage measurement system according to certain aspects of the invention.

FIG. 7 is a simplified block diagram of an embodiment illustrating certain aspects of the present invention. A computing device 70 may be provided to initiate measurements, to receive measured data and to calculate desired results. The computing device 70 can be any suitable device including a personal computer, an embedded processing system calculator or microcontroller. In certain embodiments, computing device 70 communicates with a control processor 72 configured to respond to commands from the computing device 70 and to generate control signals, manage or provide charging sources 74 and to manage or provide voltage sensing 75 of output voltages from devices under test 78. Controller 72 may also manage or provide analog-to-digital and digital-to-analog converters used in controlling the test process and measuring leakage. Controller 72 may also facilitate communications between processor 70 and test equipment and devices under test 78. The computing device 70 can be used to sequence the measurement of voltages on the devices under test 78. Sequencing can be accomplished by providing timing and order information indicating at which times the different switches should be opened or closed. This information may be provided to the controller 72 as address and time interval information, etc. Sequence information may also be directly provided as control signals to a switch matrix 76.

In certain embodiments, current and voltage source electronics 74 may be provided to generate analog currents and voltages responsive to signals received from the control processor 72. A switch matrix 76 is typically configured to receive analog voltages and currents from current and voltage source electronics 74 and to transmit these voltages and currents to devices under test 78. Sensing electronics 75 may receive signals obtained from the devices under test 78 and transmitted by switch matrix 76. Sensing electronics 75 can provide analog or digital signals representative of measurements of voltage and current values sensed by sensing electronics 75.

In certain embodiments, a single switching matrix 76 can provide switched pathways between charging sources 74 and devices under test 78 and from devices under test 78 to sensing electronics 75. Switch matrix 76 may provide and receive other signals to and from the control processor 72. In certain embodiments, separate switching matrices 76 provide pathways to and pathways from devices under test 78. In certain embodiments, switch matrix 76 can comprise more than one matrix, and can be stacked or arranged in hierarchical fashion as necessary to support the number items included in devices under test 78. In certain embodiments, switch matrix 76 may be configured to provide multiple channels, each channel associated with one or more circuits under test; channels may or may not contain capacitors. In certain embodiments, switch matrix 76 may be directly controlled by the computing device 70.

Additional Descriptions of Certain Aspects of the Invention

Certain embodiments of the invention provide methods for measuring capacitor leakage comprising the steps of providing a charging current to a plurality of capacitors, wherein the current charges and soaks the plurality of capacitors, selecting a first capacitor from the plurality of capacitors, disconnecting the charging current from the selected capacitor, determining a time required to discharge the selected capacitor by a predetermined amount, and selecting a second capacitor from the plurality of capacitors and repeating the steps of disconnecting and determining for the second selected capacitor. In certain embodiments, the step of disconnecting is performed simultaneously for all of the plurality of capacitors. In certain embodiments, the step of disconnecting is performed simultaneously for the first selected capacitor and the second selected capacitor. In certain embodiments, the step of determining is performed simultaneously for the first selected capacitor and the second selected capacitor. In certain embodiments, the step of determining includes comparing a measured voltage of the selected capacitor to a predetermined threshold voltage, wherein voltage of the selected capacitor is measured by connecting the selected capacitor to a voltage sensor. In certain embodiments, the selected capacitor is disconnected from the voltage sensor after voltage of the selected capacitor is measured. In certain embodiments, voltages on each of the first and second selected capacitors are measured periodically until a corresponding time required to discharge the first and second selected capacitors has been determined. In certain embodiments, the step of determining is performed simultaneously for each of the plurality of capacitors, wherein voltage on each capacitor in the plurality of capacitors is sequentially and periodically measured and compared to a predetermined threshold voltage. In certain embodiments, the steps of disconnecting and determining are repeated for the second selected capacitor after the time to discharge the first selected capacitor is determined. Certain embodiments also comprise the step of calculating leakage values for the first and second capacitors based on the respective times required to discharge the first and second selected capacitors by the predetermined amount.

Certain embodiments of the invention provide systems for measuring capacitor leakage comprising a plurality of charging switches, each charging switch controlling connection of one of a plurality of capacitors to a charging source, a plurality of sensing switches, each sensing switch controlling connection of one of the plurality of capacitors to a voltage sensing device, a controller operative to control the plurality of charging switches and the plurality of sensing switches wherein the controller is configured to cause all of the plurality of capacitors to be charged and soaked simultaneously, connect selected ones of the plurality of capacitors to the voltage sensing device according to a programmed sequence, and for each step in the programmed sequence, provide a measurement of voltage on a capacitor currently connected to the sensing device, and a computing device programmed to determine leakage values for each of the plurality of capacitors based on a measurement of time required for the voltage on the each capacitor to reach a threshold value after the each capacitor is disconnected from the charging source. In certain embodiments, the plurality of charging switches is provided by a switch matrix. In certain embodiments, the plurality of sensing switches is provided by a switch matrix. In certain embodiments, the plurality of charging switches and the plurality of sensing switches are provided by a switch matrix. In certain embodiments, all capacitors of the plurality of capacitors are simultaneously disconnected from the charging source. In certain embodiments, the controller is further configured to connect each of the plurality of capacitors to the sensing device periodically. In certain embodiments, the controller is further configured to disconnect each of the plurality of capacitors from the sensing device sequentially.

Certain embodiments of the invention provide methods for measuring capacitor leakage comprising providing a charging current to a plurality of capacitors, wherein the charging current charges and soaks the plurality of capacitors, sequentially connecting each of the plurality of capacitors to a voltage sensing device, monitoring voltage of the each capacitor to determine time elapsed until the monitored voltage reaches a predetermined threshold value, calculating leakage values for the plurality of capacitors based on the time elapsed for each capacitor, wherein monitoring of each capacitor commences after the each capacitor is disconnected from the charging current. In certain embodiments, all of the plurality of capacitors are disconnected from the charging current simultaneously and wherein each capacitor is periodically monitored in isolation from the other capacitors. Certain embodiments also comprise at least one other voltage sensing device, wherein the voltage of two or more capacitors are measured simultaneously.

Certain embodiments of the invention provide a method for measuring capacitor leakage comprising charging one or more capacitors with a charging source, removing the charging source from the one or more capacitors, monitoring the voltage of the one or more capacitors, and calculating capacitor leakage.

Certain embodiments of the invention provide a computer readable medium encoded with data and instructions for calculating capacitor leakage, the data and instructions causing an apparatus executing the instructions to utilize a charging source to charge one or more capacitors, remove the charging source from the one or more capacitors, monitor voltage of the one of more capacitors, and calculate capacitor leakage. Some of the embodiments further comprise soaking the capacitors. Certain of the embodiments further comprise charging one or more capacitors with a voltage source and removing the voltage source from the one or more capacitors. Certain of the embodiments further comprise charging one or more capacitors with a current source and removing the voltage source from the one or more capacitors. Certain of the embodiments further comprise monitoring the voltage of the one or more capacitors after removing the charging source. Certain of the embodiments further comprise monitoring the voltage of the one or more capacitors before and after removing the charging source. Certain of the embodiments further comprise charging one or more capacitors through a small valued series resistor. Certain of the embodiments further comprise removal of the charging source using a switch. Certain of the embodiments further comprise removal of the charging source from a plurality of capacitors using a plurality of switches. Certain of the embodiments further comprise calculating capacitor leakage by monitoring the capacitor's discharge time, monitoring the capacitor's change in voltage, and calculating the capacitor's leakage using the equation I=Cdv/dt.

Certain of the embodiments further comprise receiving a capacitor list. Certain of the embodiments further comprise inputting the capacitance of one or more capacitors. Certain of the embodiments further comprise analytically determining the capacitance of one or more capacitors. Certain of the embodiments further comprise measuring leakage of one of a plurality of capacitors while holding the other capacitors at the charging voltage. Certain of the embodiments further comprise sequentially measuring leakage of individual capacitors within a plurality of capacitors. Certain of the embodiments further comprise simultaneously disconnecting a plurality of capacitors from a charging source, and measuring the voltage of each capacitor until it reaches a predetermined threshold level.

Certain embodiments of the invention provide a system for measuring capacitor leakage comprising a communications/control processor, a charging source, a sensing electronic component, a capacitor or plurality of capacitors from which capacitor leakage measurements are desired, and a switch matrix operable to substantially simultaneously connect to a plurality of capacitors. Certain of the embodiments further comprise a personal computer operatively connected to the communications/control processor.

Although the present invention has been described with reference to specific exemplary embodiments, it will be evident to one of ordinary skill in the art that various modifications and changes may be made to these embodiments without departing from the broader spirit and scope of the invention. Accordingly, the specification and drawings are to be regarded in an illustrative rather than a restrictive sense.

What is claimed is:

1. A method for measuring capacitor leakage comprising:
    applying a current to a plurality of capacitors simultaneously, the current being applied for sufficient time to charge and soak each of the plurality of capacitors;
    discharging simultaneously the plurality of capacitors;
    measuring successively a voltage for each of the plurality of capacitors as the plurality of capacitors discharges;
    determining whether the measured voltage of a particular capacitor of the plurality of capacitors has reached a predetermined threshold value;
    recording the time duration, as measured from the start of the simultaneous discharge of the plurality of capacitors, it took for the measured voltage of the particular capacitor of the plurality of capacitors to reach the predetermined threshold value; and
    repeating the measuring, determining, and recording steps until all of the plurality capacitors has reached the predetermined threshold value.

2. The method of testing capacitor leakage of claim 1 wherein the measuring and recording the measured voltage and time duration for each of the plurality of capacitors is complete as of the recordation of the last measured voltage and time duration.

3. The method of claim 2 and further comprising calculating capacitor leakage for each of the plurality of capacitors.

4. The method of testing capacitor leakage of claim 1 wherein the plurality of capacitors are coupled to a charging circuit and a measuring circuit.

5. The method of testing capacitor leakage of claim 4 wherein the charging circuit and measuring circuit are part of a probe card testing system.

6. A system for measuring capacitor leakage comprising:
    a plurality of charging switches each charging switch controlling connection of one of a plurality of capacitors to a charging source;
    a plurality of sensing switches, each sensing switch controlling connection of one of the plurality of capacitors to a voltage sensing device;
    a controller operative to control the plurality of charging switches and the plurality of sensing switches wherein the controller is configured to cause all of the plurality of capacitors to be charged and soaked simultaneously, discharge the plurality of capacitors simultaneously, connect selected ones of the plurality of capacitors to the voltage sensing device to measure successively a voltage for each of the plurality of capacitors as the plurality of capacitors discharges, determine when the measured voltage of a particular capacitor of the plurality of capacitors has reached a predetermined threshold value, record the time duration, as measured from the start of the simultaneous discharge of the plurality of capacitors, it took for the measured voltage of the particular capacitor of the plurality of capacitors to reach the predetermined threshold value, and repeat the measurement, determination and recordation until all of the plurality of capacitors has reached the predetermined threshold value.

7. The system of testing capacitor leakage of claim 6 wherein the measurement and recordation of the measured voltage and time duration for each of the plurality of capacitors is complete as of the recordation of the last measured voltage and time duration.

8. The system of claim 7 wherein the controller is further configured to calculate capacitor leakage for each of the plurality of capacitors.

9. The system of claim 7 wherein the system is a probe card testing system.

* * * * *

UNITED STATES PATENT AND TRADEMARK OFFICE
CERTIFICATE OF CORRECTION

| | | |
|---|---|---|
| PATENT NO. | : 7,663,382 B2 | Page 1 of 1 |
| APPLICATION NO. | : 11/668457 | |
| DATED | : February 16, 2010 | |
| INVENTOR(S) | : Charles Corulli et al. | |

It is certified that error appears in the above-identified patent and that said Letters Patent is hereby corrected as shown below:

Column 9, line 36, In Claim 1, after "a" delete "current" and insert in place thereof --voltage--.

Column 9, line 37, In Claim 1, after "the" delete "current" and insert in place thereof --voltage--.

Column 9, line 42, In Claim 1, delete "whether" and insert in place thereof --when--.

Signed and Sealed this

Fourth Day of May, 2010

David J. Kappos
*Director of the United States Patent and Trademark Office*